United States Patent
De Burgh et al.

(10) Patent No.: US 12,126,973 B2
(45) Date of Patent: Oct. 22, 2024

(54) DYNAMIC RANGE COMPRESSION WITH REDUCED ARTIFACTS

(71) Applicant: DOLBY LABORATORIES LICENSING CORPORATION, San Francisco, CA (US)

(72) Inventors: Mark David De Burgh, Mount Colah (AU); Ning Wang, Epping (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 231 days.

(21) Appl. No.: 17/642,211

(22) PCT Filed: Sep. 10, 2020

(86) PCT No.: PCT/US2020/050061
§ 371 (c)(1),
(2) Date: Mar. 10, 2022

(87) PCT Pub. No.: WO2021/050639
PCT Pub. Date: Mar. 18, 2021

(65) Prior Publication Data
US 2022/0322004 A1    Oct. 6, 2022

Related U.S. Application Data

(60) Provisional application No. 62/899,769, filed on Sep. 13, 2019.

(30) Foreign Application Priority Data

Sep. 13, 2019 (EP) .................................... 19197154

(51) Int. Cl.
*H04R 3/04* (2006.01)

(52) U.S. Cl.
CPC ........... *H04R 3/04* (2013.01); *H04R 2430/01* (2013.01)

(58) Field of Classification Search
CPC ...... H04R 3/04; H04R 2430/01; H03G 7/007; H03G 9/025; H03G 7/002; G10L 19/00
(Continued)

(56) References Cited

U.S. PATENT DOCUMENTS 7,848,531 B1   12/2010 Vickers
8,194,889 B2   6/2012 Seefeldt
(Continued)

FOREIGN PATENT DOCUMENTS

ES    2482147    8/2014
JP    2012065068 A    3/2012
(Continued)

OTHER PUBLICATIONS

Grimm, G. et al "Auditory Model-Based Dynamic Compression Controlled by Subband Instantaneous Frequency and Speech Presence Probability Estimates IEEE/ACM Transactions on Audio, Speech, and Language Processing, Oct. 2016, pp. 1759-1772. Date of publication: Oct. 2016".

*Primary Examiner* — Carolyn R Edwards
*Assistant Examiner* — Friedrich Fahnert

(57) ABSTRACT

Methods for performing dynamic range compression (DRC) on audio in a manner intended to produce output audio for playback by systems or devices with limited power handling capabilities and preferably also to reduce or prevent undesirable artifacts (e.g., pumping and/or breathing) in the output audio. Some embodiments perform the DRC so as to maximize average loudness (while preventing loss of quieter elements) during playback, and also to reduce or prevent distortion. Other aspects are systems or devices configured to perform embodiments of the method. In some embodi-
(Continued)

ments, reduced DRC is applied when average loudness of the input audio approaches (or matches or exceeds) a target (e.g., a knee point for DRC, or a signal level near to a maximum playback level of the intended playback system), since such input audio is assumed to have already been compressed, and otherwise applying full DRC to the input audio.

27 Claims, 2 Drawing Sheets

(58) Field of Classification Search
USPC .......................................................... 381/57
See application file for complete search history.

(56) References Cited

U.S. PATENT DOCUMENTS

| | | | |
|---|---|---|---|
| 8,903,729 B2 | 12/2014 | Riedmiller | |
| 8,924,220 B2 | 12/2014 | Hosokawa | |
| 9,462,381 B2 | 10/2016 | Krishnaswamy | |
| 9,647,624 B2 | 5/2017 | Li | |
| 9,672,834 B2 | 6/2017 | Pandey | |
| 9,673,770 B2 | 6/2017 | Vickers | |
| 9,762,198 B2 | 9/2017 | Seefeldt | |
| 9,947,335 B2 | 4/2018 | Hedelin | |
| 10,095,468 B2 | 10/2018 | Koppens | |
| 10,396,743 B2 | 8/2019 | Gautama | |
| 2009/0074209 A1 | 3/2009 | Thompson | |
| 2009/0097676 A1* | 4/2009 | Seefeldt | H03G 9/18 |
| | | | 381/107 |
| 2016/0381468 A1* | 12/2016 | Petrausch | H04R 25/505 |
| | | | 381/320 |
| 2018/0095718 A1 | 4/2018 | Riedmiller | |
| 2018/0192229 A1 | 7/2018 | Easley | |
| 2019/0115896 A1 | 4/2019 | Seefeldt | |

FOREIGN PATENT DOCUMENTS

| | | |
|---|---|---|
| WO | 2013038451 A1 | 3/2013 |
| WO | 2016155853 A1 | 10/2016 |

* cited by examiner

DYNAMIC RANGE COMPRESSION WITH REDUCED ARTIFACTS

CROSS-REFERENCE TO RELATED APPLICATIONS

This application claims priority to European Patent Application No. 19197154.8, filed 13 Sep. 2019 and U. S. Provisional Patent Application No. 62/899,769, filed 13 Sep. 2019, which are incorporated herein by reference.

TECHNICAL FIELD

The present disclosure relates to dynamic range compression of audio signals.

BACKGROUND

Herein, dynamic range compression will sometimes be referred to as "DRC" and a dynamic range compressor will sometimes also be referred to as a "DRC."

As shown in FIG. 1, a traditional dynamic range compressor ("DRC") includes a level estimator 1, a dynamic range compression (DRC) gain determining subsystem 6, and a gain application subsystem 7, coupled as shown. In some implementations, gain determining subsystem 6 includes a smoother 3, and a dynamic range compression (DRC) gain curve subsystem 5, coupled as shown. Subsystem 7 is coupled and configured to apply a time varying gain, g(t) (e.g., a sequence of gain values), which is output from subsystem 6 (e.g., from subsystem 5 of subsystem 6, as shown in FIG. 1), to an input audio signal to produce an audio output signal.

The dynamic range compression applied to the input audio signal reduces the power of segments of the input audio signal (i.e., subsystem 7 applies to such segments gain(s) determined by subsystem 6, which are less than unity gain(s)) for which the smoothed level (output from smoother 3) is above a threshold (a first knee point), and may also increase the power of segments of the input audio signal (i.e., subsystem 7 may apply greater than unity gain(s) determined by subsystem 6, to such segments) for which the smoothed level (output from smoother 3) is below a second threshold (a "lower" knee point).

The dynamic range compression (DRC) has an attack (an attack interval which begins at or near each time that the input audio level (e.g., as indicated by the output of level estimator 1) rises to a knee point, and which has a duration known as an attack time) and a release (a release interval which begins at or near each time that the input audio level falls back to the knee point, and which has a duration known as a release time). Full DRC is applied during the interval after the attack and before the release. The amount of DRC applied may increase from zero (when subsystem 6 outputs unity gain) to the full amount during the attack, and then fall back to zero during the release.

In DRC, one important possibility is there is a large gain for low level input audio below a knee point, and the gain then reduces monotonically to unity gain as the input signal level approaches its maximum level. Thus, the DRC never actually reduces a high level of the input audio, and instead it just increases lower levels of the input audio. Such a case would occur when the DRC is employed in an effort to get maximum loudness from a low powered system.

When the input audio signal jumps to a maximum or minimum level, this change is indicated by the output of level estimator 1 of FIG. 1, but the DRC gain (which is output from subsystem 6) will typically not immediately change to its full value (i.e., the value it would have if the input audio signal level were fixed at, and did not jump to, the maximum or minimum level). Instead, the DRC gain changes smoothly to the full value (e.g., due to presence of smoother 3 in FIG. 1). The time required for the DRC gain to reach its full value (after a jump of input signal level up to a maximum level) is the attack time, and the time required for the DRC gain to reach its full value (after a jump of input signal level down to a minimum level) is the release time. When attack and release times are quoted (e.g., in system specifications), the quoted attack (or release) time is often the time required for DRC gain to reach halfway toward its full value (after a jump in input signal level), since the DRC gain will typically approach its full value exponentially.

In the implementation shown in FIG. 1, the smoother 3 (i.e., the smoothing time constant employed by smoother 3) determines the attack time and the release time (the attack time may be equal to or different than the release time, and one or both of them may be equal to zero).

In other implementations (not specifically shown in FIG. 1) of subsystem 6, smoother 3 is replaced by another element (e.g., a smoother which operates on gain values output from DRC gain curve subsystem 5) or subsystem which determines attack and release times for each interval of DRC application by subsystem 6. In general, subsystem 6 is configured to determine (e.g., in response to user selection) attack and release times for each interval during which subsystem 6 applies DRC (i.e., each interval in which subsystem 6 outputs non-unity gain(s)).

In some implementations of dynamic range compression, performance of the compression is split in such a way that the gain application subsystem (e.g., subsystem 7) is implemented in a decoder or playback system or device, other elements of the compression (e.g., subsystems 1 and 6) are implemented in a encoder, and the gain g(t) is sent (to the decoder, or playback system or device) as metadata along with the input audio in an encoded bitstream. We contemplate that some embodiments of the invention (to be described below) are so implemented.

Level estimator 1 is coupled and configured to determine, and provide to subsystem 6 (e.g., to smoother 3 in the implementation shown in FIG. 1) a level estimate. The level estimate is an estimate (which typically varies over time) of loudness of the input audio signal (e.g., the level estimate is indicative of a sequence of average level or average power values, where each averaging time is sufficiently long for stability of the dynamic range compression applied by the FIG. 1 system). One typical level estimate is average power. Another example of a level estimate is loudness as defined by the ITU-R BS.1770 loudness standard. Smoother 3 is coupled and configured to apply smoothing to the level estimate output from estimator 1, to generate (and assert to subsystem 5) a smoothed estimate (smoothed level estimate) of the average level or power of the input audio signal.

In the implementation shown in FIG. 1, in response to the smoothed level estimate (e.g., a smoothed sequence of values of average level or power) determined by smoother 3, subsystem 5 determines a sequence of values of gain g(t). Subsystem 5 implements a function (typically referred to as a "DRC gain curve") that maps each value (of average level or power) output from smoother 3 to a value (a gain value) of the gain g(t). Gain element 7 applies the gain g(t) to the input audio signal to generate the output audio signal (which is a dynamic range compressed version of the input audio signal), e.g., by applying each value (of a sequence of values) of the gain g(t) to a corresponding value (e.g., of a sequence of values) of the input audio signal.

In some other implementations, subsystem 6 applies a DRC gain curve that maps each value (of average level or power) output from level estimator 1 (rather than from a smoother 3 as shown in FIG. 1) to a value (a gain value) of the gain g(t), including by implementing DRC attack and release (with determined attack and release times for each interval of DRC application by subsystem 6), and the gain values g(t) (optionally modified to implement an attack or release) are provided to gain element 7.

BRIEF DESCRIPTION OF THE INVENTION

Some embodiments of the present invention are methods for performing dynamic range compression (DRC) on an audio signal in a manner intended to produce output audio for playback (e.g., optimized for playback) by systems or devices with limited power handling capabilities (e.g., a notebook, laptop, tablet, soundbar, mobile phone, or other device including or for use with small speakers) and preferably also to reduce or prevent occurrence of undesirable artifacts (e.g., those known as "pumping" and "breathing") in the output audio. In some embodiments, the DRC is performed so as (or in a manner intended) to maximize (or provide sufficiently large) average loudness (while preventing loss of quieter elements of the audio) during playback, and also to reduce or prevent distortion (e.g., to reduce or prevent occurrence of pumping and/or breathing artifacts, and/or timbre changes due to frequency components generated by the nonlinear gain application of the DRC). Some embodiments perform DRC on an audio signal in a manner intended to optimize content for radio broadcast, or general audibility of audio content or components within an audio stream.

Herein, we sometimes use the expression "DRC application time" to denote the attack time (or release time) of an instance of application of DRC (e.g., an instance of application which applies non-unity gain, or for which a DRC gain curve determines non-unity gain, after an attack and before a release), or the duration of such an instance of application of DRC (including attack and release).

In a first class of embodiments of the inventive dynamic range compression (DRC) method, reduced DRC (e.g., no DRC) is applied to an input audio signal when average loudness (e.g., average level or power) of the input audio signal approaches (or matches or exceeds) a target, since such an input audio signal is assumed to have already been compressed (e.g., so as to maximize loudness while preventing quieter elements of the audio from being lost during playback), and otherwise applying full DRC to the input audio signal. Application of reduced DRC (e.g., no DRC) when full DRC is unnecessary, reduces or prevents occurrence of pumping and/or breathing artifacts that would otherwise result from full DRC. The average loudness is determined over a time (an "averaging" time) that is longer (e.g., much longer) than the DRC application time of the DRC. The target can be a target signal level or signal power. In typical embodiments in the first class, the target is a knee point for the DRC, or an audio signal level near (e.g., equal or substantially equal) to the maximum playback level of the playback system or device which is to play the output audio.

A second class of embodiments of the inventive dynamic range compression (DRC) method is directed at reducing pumping artifacts during performance of DRC on input audio having regular transients (e.g., a sequence of identical or similar transients). Typical embodiments in the second class control a release time constant (of the release of each application of dynamic range compression), including by implementing a first release time constant (referred to as a relatively slow release time constant) when a segment of the input audio signal includes regular transients, including by applying smoothed dynamic range compression gains to the segment of the input audio signal, and implementing a relatively fast release time constant (i.e., a release time constant faster than the first release time constant) when a different segment of the input audio signal does not include regular transients, including by applying non-smoothed dynamic range compression gains to said different segment of the input audio signal. At times when the relatively slow release time constant is implemented, pumping artifacts are reduced or their occurrence is prevented.

A third class of embodiments of the inventive dynamic range compression (DRC) method is directed at reducing breathing artifacts during performance of DRC on decaying input audio. Typical embodiments in the third class control a release time constant (of the release of each application of dynamic range compression) in response to a loudness slope of the input audio signal. This control typically implements a faster release time constant (to reduce or prevent occurrence of breathing artifacts) in response to increased steepness of the loudness slope, and a slower release time constant (to reduce or prevent occurrence of pumping artifacts) in response to a decreased steepness of the loudness slope.

Another aspect of the invention is a system (e.g., a dynamic range compressor) or device configured to perform any embodiment of the inventive method on an input audio signal. In a class of embodiments, the invention is an audio playback system (e.g., a notebook, laptop, tablet, soundbar, mobile phone, or other device with (or for use with) small speakers, or a playback system which has limited (e.g., physically-limited) power handling capabilities) configured to perform dynamic range compression (in accordance with any embodiment of the inventive method) to generate dynamic range compressed audio, and to perform playback of the dynamic range compressed audio.

In some embodiments, the inventive system is or includes a general or special purpose processor programmed with software (or firmware) and/or otherwise configured to perform an embodiment of the inventive method. In some embodiments, the inventive system is a general purpose processor, coupled to receive input audio data, and programmed (with appropriate software) to generate output audio data by performing an embodiment of the inventive method. In some embodiments, the inventive system is a digital signal processor, coupled to receive input audio data, and configured (e.g., programmed) to generate output audio data in response to the input audio data by performing an embodiment of the inventive method.

Aspects of the invention include a system configured (e.g., programmed) to perform any embodiment of the inventive method, and a computer readable medium (e.g., a disc) which stores code for implementing any embodiment of the inventive method.

DETAILED DESCRIPTION OF EMBODIMENTS

Some embodiments of the present invention provide improvements and technical solutions to reduce or prevent the occurrence of undesirable (e.g., annoying) artifacts known as "pumping" and "breathing" as a result of dynamic range compression. Different classes of embodiments implement different approaches (described herein) for preventing or reducing such pumping and breathing artifacts.

A first class of embodiments of the inventive dynamic range compressor and dynamic range compression (DRC) method will be described with reference to FIG. 2. In some embodiments in this class, the DRC applies (or the dynamic range compressor is configured to apply) reduced DRC (e.g., no DRC) to an input audio signal when the average level (or power) of the input audio signal approaches (or matches or exceeds) a target (e.g., a high average level), since such an input audio signal is assumed to have already been compressed. The average level (or power) of the input audio signal is determined over a time (an "averaging time") that is longer (e.g., much longer) than each attack time and/or each release time of the dynamic range compression, and the reduced DRC is applied "when" the signal has the average level (or power) in the sense that it is applied to each segment (of duration equal to or greater than the averaging time) of the input audio signal having the average level (or power). With reference to the first class of embodiments, the expression "target" is used in a broad sense to denote a target signal level (or signal power), whose value is such that an input audio signal whose average level (or power) approaches (or matches or exceeds) the target can reasonably be assumed to have already been compressed. In typical embodiments in the first class, the target level is a knee point for DRC, or an audio signal level near to the maximum playback level of the playback system or device which is to play the output audio.

Figure 1:
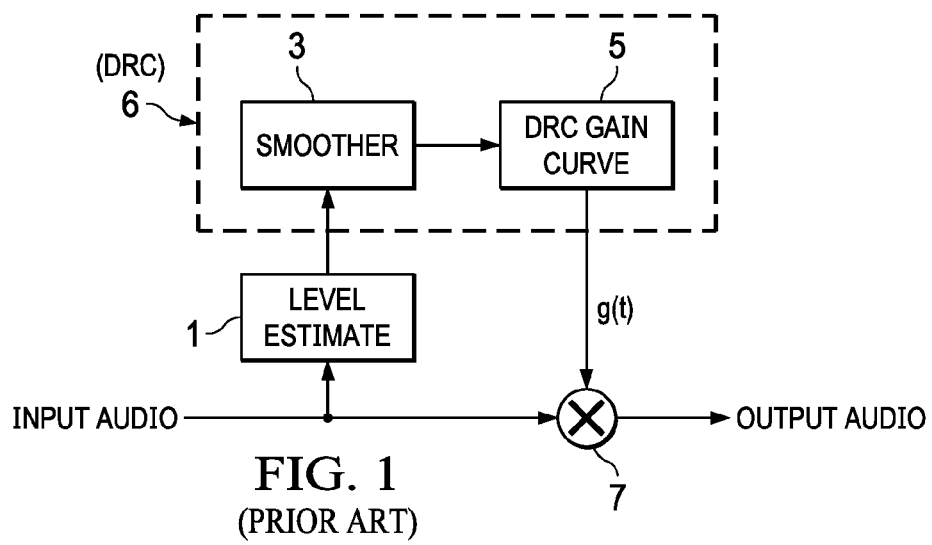
FIG. 1 is a block diagram of a conventional system configured to perform dynamic range compression on an input audio signal.
Figure 2:
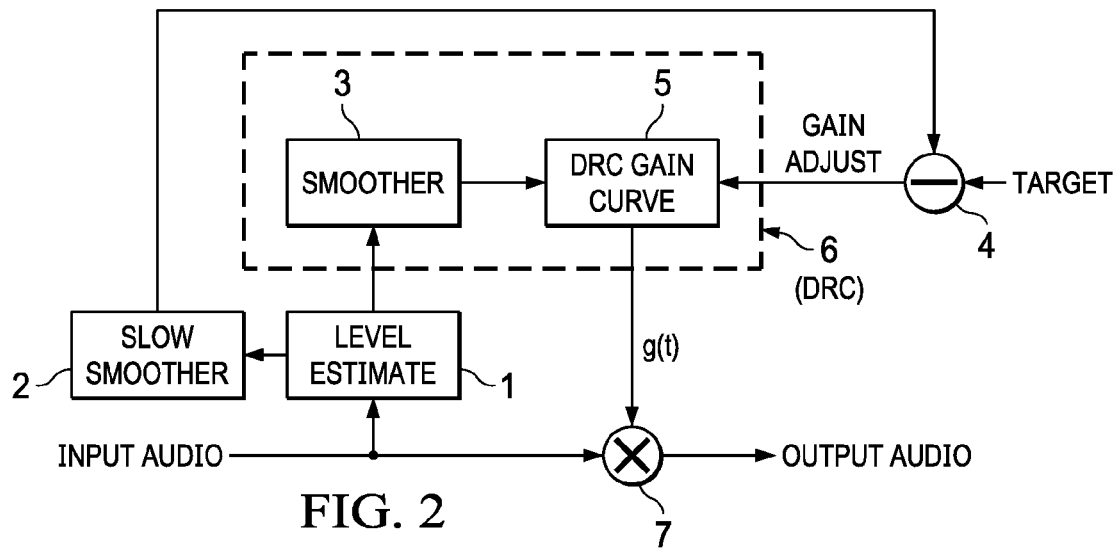
FIG. 2 is a block diagram of an embodiment of the inventive dynamic range compression system.

The dynamic range compressor of FIG. 2 is an example embodiment in the first class of embodiments. The compressor of FIG. 2 differs from the conventional dynamic range compressor of FIG. 1 in that the FIG. 2 compressor (but not the FIG. 1 compressor) includes a slow smoother 2 and a gain adjustment subsystem 4, coupled as shown. The other elements (elements 1, 6, and 7) of the DRC of FIG. 2 are identical to the corresponding (identically numbered) elements of the DRC of FIG. 1. Subsystem 6 of FIG. 2 may be implemented (e.g., to include elements 3 and 5 of FIG. 1) in any of the ways that subsystem 6 of FIG. 1 may be implemented.

A typical DRC gain curve (e.g., implemented by subsystem 5 of FIG. 1 or 2) determines a gain value (a value of gain g(t) of FIG. 1 or 2) which is:

lower than unity, in response to an audio signal having high average level or power (e.g., a smoothed level output from smoother 3), which is above a threshold (a knee point), unity, in response to an audio signal having average level or power (e.g., a smoothed level output from smoother 3) which is below the knee point but above a second threshold (a second knee point), and higher than unity, in response to an audio signal having low average level or power, which is below the second threshold, such that DRC (which generates an output audio signal in response to an input audio signal) maintains a monotonic increase of average output audio signal level (or power) with increasing average input signal level (or power). The gain values determined by the DRC gain curve (and output from subsystem 6 of FIG. 1 or FIG. 2) change dynamically in response to changing average level (or power) of the input audio signal. However, this can result in undesirable artifacts (e.g., pumping artifacts) in the output audio signal, especially when the input signal's average level (or power) is close to a knee point of the DRC gain curve.

The inventors have recognized that if an input audio signal is already well compressed (and can be played with sufficient loudness by the intended playback device), an ideal DRC system would apply less DRC (e.g., no DRC) to the input audio signal than it would to another input audio signal. In other words, the ideal DRC system would "get out of the way" (and thus introduce no significant pumping artifacts) to the well compressed (and sufficiently loud) input audio signal. The inventors have further recognized that when an input audio signal has average level or power which approaches (or matches or exceeds) an appropriate target value (e.g., a target value that is sufficiently high that the input audio signal can reasonably be assumed to have already been compressed and to be playable with sufficient loudness by the intended playback device), and when the average is determined over a sufficiently long time interval (i.e., an interval longer (e.g., much longer) than each attack time and/or each release time of the dynamic range compression), a DRC system should apply less DRC to the input audio signal than it would to another input audio signal (i.e., the DRC system should "get out of the way," and thus introduce no significant pumping artifacts to the input audio signal).

With reference again to FIG. 2, slow smoother 2 generates (and provides to gain adjustment subsystem 4) a slowly smoothed version of the level (or power) estimate output from level estimator 1. The output of slow smoother 2 is an estimate of average level or power of the input audio signal, where the average is over a longer (e.g., much longer) time than the attack time (and/or release time) being employed by subsystem 6 (or than the duration of each application, include attack and release, of DRC with non-unity gain by subsystems 6 and 7).

Herein, we sometimes use the expression "DRC application time" to denote the attack time (or release time) of an instance of application of DRC (e.g., an instance of application which applies non-unity gain, or for which a DRC gain curve determines non-unity gain, after an attack and before a release), or the duration of such an instance of application of DRC (including attack and release).

Herein, we use the term "loudness" to denote level (e.g., average level) or power (e.g., average power).

Thus, slow smoother 2 is configured to determine average loudness of the input audio signal, where the average is over a longer (e.g., much longer) time than a DRC application time (e.g., a typical DRC application time) implemented by subsystems 6 and 7. In some embodiments (e.g., those described below with reference to FIG. 2A), the loudness is determined from metadata provided with (e.g., included in) the input audio signal.

The output of slow smoother 2 is used by gain adjustment subsystem 4 to constrain the gains output by (i.e., the gains indicated by the time-varying gain g(t) output from) DRC subsystem 6. Subsystem 4 is coupled and configured to operate in response to a target (a target level or power), identified as "Target" in FIG. 2. As the output of slow smoother 2 (an average of input audio signal level or power) approaches (or matches or exceeds) the target, subsystem 4 asserts control data (identified as "Gain adjust" values in FIG. 2) to subsystem 6, to cause the gains output by subsystem 6 to approach unity gains (i.e., to be equal to unity gain, or to be closer to unity gain than they would be if subsystem 4 were disabled or omitted). In some implementations, the difference between the current output of slow smoother 2 and the target determines each current one of the Gain adjust values.

Thus, the DRC system of FIG. 2 "gets out of the way" (i.e., applies reduced DRC, e.g., no DRC) when the output of slow smoother 2 approaches (or matches or exceeds) the target, and otherwise applies full DRC (i.e., the DRC which it would apply if subsystems 2 and 4 were omitted or disabled).

The target (in response to which subsystem 4 operates) may be a knee point of the DRC applied by subsystem 6 (e.g., so that when the output of slow smoother 2 is at least substantially equal to the knee point, subsystem 6 outputs unity gain). The knee point may be the input signal level above which the DRC gain curve specifies less than unity gain values, so that when the output of slow smoother 2 is at least substantially equal to such knee point, it is reasonable to assume that the input audio is already compressed. In some other embodiments, the target is a value equal (or substantially equal) to the maximum playback level of the playback system or device which is to play the output audio. With such a target, it is also reasonable to assume that the input audio is already compressed.

One traditional approach to DRC (e.g., DRC as performed by the FIG. 1 system) is to apply some slow moving AGC (automatic gain control) prior to the DRC, to cause the average level of the AGC-leveled audio content to match a desired target level (before applying DRC), and to implement the DRC gain curve to have a guard band around this target level (so that no DRC is applied, e.g., DRC applies unity gain, to each segment of the AGC-leveled audio having average level in the guard band). However, when the traditional DRC (with or without the guard band) is performed on the AGC-leveled audio, undesirable DRC artifacts (e.g., pumping and/or breathing) can result. Also, the traditional guard band may be sub-optimally placed to reduce pumping or other artifacts. Also, in a playback system (which implements the traditional DRC), the average mastering level of the original content (before application of the AGC) is often unknown, and so operation of the system cannot reasonably assume that reduced (or no) DRC should be applied to any segment of the AGC-leveled audio. Depending on the characteristics of the original (pre-AGC) content, it may be undesirable to perform DRC on the AGC-leveled audio, even with a guard band around the AGC target level. Also, an unknown digital volume control has often been applied to the input audio, and the traditional AGC leveller will "fight" against such a volume control, resulting in an unappealing user experience during playback.

In contrast with the traditional approach, the FIG. 2 system performs DRC in a manner controlled (in part) by average level or power of the input audio (i.e., the output of slow smoother 2 of FIG. 2), where the average is determined over an interval that is longer (e.g., much longer) than each attack time and/or each release time of application (with non-unity gain) of DRC by subsystems 6 and 7 (or longer (e.g., much longer) than the duration of each application, include an attack and a release, by subsystems 6 and 7 of DRC with non-unity gain). If AGC is performed on the input audio signal of the FIG. 2 system, the signal level (or power) whose average is determined (by slow smoother 2), so that the resulting average level or power can be used (by subsystem 4 of FIG. 2) to control the DRC, must be the level or power of the original signal before application of the AGC.

To appreciate benefits of typical operation of the FIG. 2 system (and other embodiments in the first class), consider the case that the input audio signal is a well mastered signal that on average is at exactly the correct level, so the input audio signal (to undergo DRC) has already been through a variety of compression. This is likely to be the case with music, since engineers know that mastered music will likely be played in environments (e.g., in cars) that have a lot of background noise. The best thing that an embodiment of the inventive DRC can do in this case is to completely leave the input signal alone. Even a well compressed track will include soft (quiet) bits, for example, a drum hit is commonly followed by a reverb tail that is supposed to gradually fade away containing pretty much every input level. Typically, any traditional DRC method will end up boosting the quiet bits, because that is essentially what dynamic range compression means, but the resulting output audio will not sound as good as doing nothing. Performing traditional DRC on a well mastered track, which has already been compressed, will diverge from the artist's intent.

In contrast, control of the DRC applied by the FIG. 2 system (i.e., the control implemented by elements 2 and 4 of FIG. 2) is determined by a slowly smoothed (averaged) version of the input signal level (or power), so that when the averaged input level or power (indicated by the output of slow smoother 2) is near to (or matches or exceeds) the target (which will be the case with well mastered, sufficiently loud, input audio), the DRC is effectively disabled or reduced.

As a practical matter, when audio is to be played by a laptop or mobile phone (or other playback system or device having limited power handling capability), there is typically a struggle to get enough playback level for the user to listen comfortably. The target digital averaged playback level typically must be very high, to achieve playback with a reasonable loudness using the playback device. The exact value of the target averaged level is very dependent on the specific device, but it is typically high (i.e., substantially equal to or greater than a typical value of the Target provided to subsystem 4 of the FIG. 2 embodiment). For music (or other audio) to achieve such a high incoming average level, it must have already been through significant compression, and so we know the best thing for a DRC system to do is to leave it alone. Operation of typical implementations of the FIG. 2 system would disable or reduce application of DRC to such music (or other audio).

Input audio (e.g., music tracks) with average input level (as determined by the output of a typical implementation of slow smoother 2 of FIG. 2) significantly lower than the Target (provided to subsystem 4 of the FIG. 2 embodiment) will have peaks that are much louder than the average level, and quiet bits below the average level. In this case, it should be assumed that the lower digital levels were intended to be audible, and more dynamic range compression is needed. Operation of typical implementations of the FIG. 2 system would not disable or reduce application of DRC to such input audio.

It should be appreciated that a slow moving average of the level or power of an audio signal (as indicated by the output of slow smoother 2 of FIG. 2) already puts constraints on dynamic range of the signal. The DRC curve (implemented by DRC subsystem 6 of FIG. 2) no longer needs to be applied (or applied fully) when the slow moving average is close to a DRC knee point or close to the maximum signal level (where "maximum signal level" here denotes the maximum playback level of the intended playback system or device).

Figure 2A:
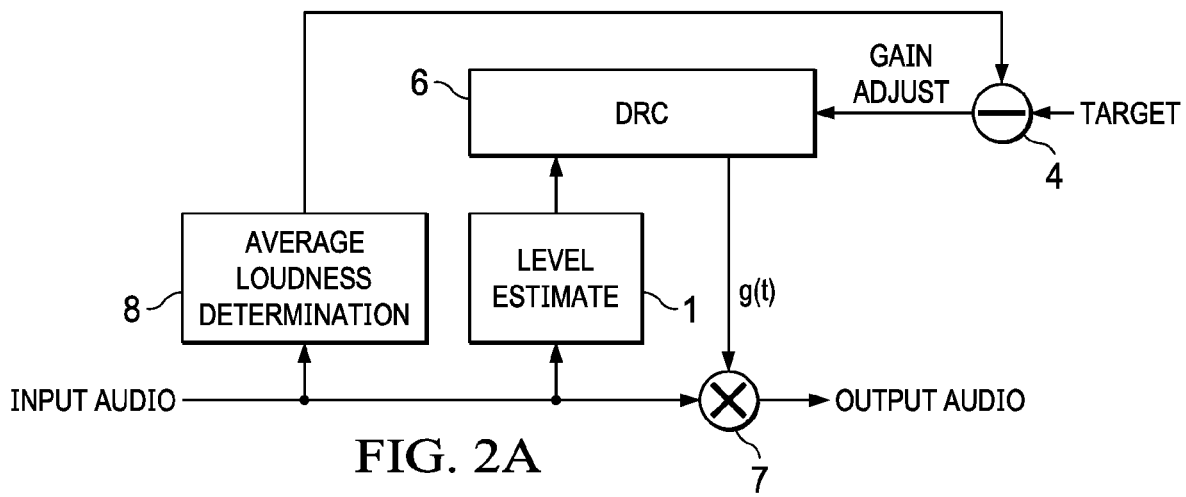
FIG. 2A is a block diagram of another embodiment of the inventive dynamic range compression system.

Next with reference to FIG. 2A, we describe another embodiment in the above-noted first class of embodiments. The system (a dynamic range compressor or DRC) of FIG. 2A differs from the system (also a dynamic range compressor or DRC) of FIG. 2 in that the DRC of FIG. 2A includes average loudness determination subsystem 8, rather than slow smoother 2. The other elements (elements 1, 4, 6, and 7) of FIG. 2A are identical to the corresponding (identically numbered) elements of FIG. 2. Subsystem 6 of FIG. 2A may be implemented (e.g., to include elements 3 and 5 of FIG. 1) in any of the ways that subsystem 6 of FIG. 2 may be implemented.

DRC in accordance with some embodiments of the invention (e.g., typical implementations of FIG. 2A) is implemented in a digital signal processor (e.g., one which implements the Dolby Volume playback volume control, or playback volume control or loudness leveling of another type) configured (e.g., programmed with software) to apply loudness based processing to input audio data indicative of an audio program. Such loudness based processing may use metadata (provided with and corresponding to the audio data) indicative of loudness of the audio content, and/or loudness processing state of the audio content (e.g. what type(s) of loudness processing have been performed on the audio content).

In the FIG. 2A system, average loudness determination subsystem 8 is configured to determine (and to provide to gain adjustment subsystem 4) data indicative of average loudness (e.g., average level) of the input audio data (an input audio signal), where the average is over a time (an "averaging" time) that is longer (e.g., much longer) than each attack time and/or each release time of the dynamic range compression applied by subsystems 6 and 7 (or than the duration of each application, include attack and release, of DRC by subsystems 6 and 7 with non-unity gain). In some implementations, the input audio data is included in a Dolby Digital bitstream (which also includes metadata corresponding to the audio data). In some implementations, subsystem 8 may be configured to parse metadata (provided with the input audio data) to identify metadata indicative of loudness of each of a sequence of segments (e.g., frames) of the input audio data, and if necessary, to determine from the metadata a sequence of averages of such loudnesses (where each of the averages in the sequence is over a sufficiently long averaging time). In some implementations, subsystem 8 may implement a model of the behavior of the middle ear and the cochlea and psychoacoustic models of loudness.

The output of subsystem 8 is used (in subsystem 4 of FIG. 2A) in the same way that the output of slow smoother 2 is used (in subsystem 4) in the FIG. 2 embodiment.

In some alternative implementations, subsystem 6 of the FIG. 2A system (or subsystem 6 of another embodiment of the invention) implements a DRC curve which maps input loudness to output loudness (so that the subsystem 6 outputs loudness difference values, rather than gain values). In such implementations, subsystem 7 maps each loudness difference value to the corresponding gain change to apply to the input audio signal.

For many applications, we contemplate that it is desirable to employ a multiband implementation of the system (a dynamic range compressor) of FIG. 2 or FIG. 2A (or a multiband implementation of the system of FIG. 3 or FIG. 4, to be described below).

In a multiband implementation of the system of FIG. 2 (or FIG. 2A), the input audio is split (e.g., by a filterbank) into multiple frequency bands. An average loudness (e.g., average loudness indicated by metadata or averaged metadata, or average level, or average power) is determined (by subsystem 2 of FIG. 2 or subsystem 8 of FIG. 2A) for each of the frequency bands. For each band, the average loudness is over a time (an "averaging" time) that is longer (e.g., much longer) than each attack time and/or each release time of the dynamic range compression applied by subsystems 6 and 7 (or than the duration of each application, include attack and release, of DRC by subsystems 6 and 7 with non-unity gain). Subsystem 6 implements a set of DRC gain curves (one DRC gain curve for each frequency band). For each individual frequency band, a sequence of gain values (output from subsystem 6 for the band) is applied (by subsystem 7) to the corresponding band of the input audio, thereby generating each frequency band of the output audio. The frequency bands of the output audio may be combined to generate an output audio signal. In other words, DRC gain values (for each band) determined by the DRC gain curves are applied in individual bands of the input audio, to generate "dynamic range compressed" audio in each of the bands), and the "dynamic range compressed" audio (in each of the individual bands) may then be combined to form the output audio signal. In an embodiment, a DRC gain may thus be determined for at least one frequency band of the multiple frequency bands and the DRC gain may be applied to said frequency band.

In some implementations, subsystem 4 uses average loudness values determined for each of the individual frequency bands to determine the "Gain adjust" values (indicated in FIGS. 2 and 2A) which are used to control application of DRC (in such implementations, each of the Gain adjust values pertains to an individual frequency band of the input audio). In some other implementations, a single (wideband) average loudness value is determined (by subsystem 2 of FIG. 2 or subsystem 8 of FIG. 2A), and this single average loudness value (which typically varies over time, since it pertains to a sequence of different segments of the input audio) is used by subsystem 4 to determine the "Gain adjust" values (indicated in FIGS. 2 and 2A) which are used to control application of DRC. In the latter implementations, each of the Gain adjust values (which pertains to the wideband input audio; not to an individual frequency band of the input audio) is applied to all of the DRC gain curves (and each of the DRC gain curves pertains to a different one of the frequency bands). In some of the latter implementations, the difference between the wideband average loudness value and the target is used to generate the Gain adjust values which are employed to control application of the per band DRC gain curves.

In the multiband implementations, determination of the DRC gains (to be applied by subsystem 7) typically includes smoothing of gains for individual ones of the bands (e.g., gains determined by DRC gain curves for the individual ones of the bands) across bands to improve timbre. In the multiband implementations, different bands may have different DRC knee points, and thus the target (typically a chosen wideband target) will not necessarily match a particular knee point for an individual band.

We contemplate that various known methods which may reduce pumping and breathing artifacts during DRC (e.g., some methods of the type implemented in a Dolby Volume loudness leveler) may be implemented in combination with some embodiments of the inventive DRC. Examples of such methods include:

auditory scene analysis, where gain changes are applied with greater strength on auditory scene changes; and hierarchical constraints, where gains in individual frequency bands are constrained by channel gains and channel gains by total level.

For example, a DRC system implemented in accordance with above-described FIG. 2A (or FIG. 2) may also implement audio scene analysis to further control performance of the DRC.

A second class of embodiments of the present invention is directed at reducing pumping artifacts during performance of DRC on input audio having regular transients (e.g., a sequence of identical or similar transients). Typical embodiments in the second class control (e.g., include a subsystem which is configured to control) a release time constant (of the release of each application of dynamic range compression), including by implementing a first release time constant (referred to as a relatively slow release time constant) when a segment of the input audio signal includes regular transients, including by applying smoothed dynamic range compression gains to the segment of the input audio signal, and implementing a relatively fast release time constant (i.e., a release time constant faster than the first release time constant) when a different segment of the input audio signal does not include regular transients, including by applying non-smoothed dynamic range compression gains to said different segment of the input audio signal. At times when the relatively slow release time constant is implemented, pumping artifacts are reduced or their occurrence is prevented.

In audio (especially music) there are often regular transients, that cause the repeated attack and release of a conventional DRC (dynamic range compressor). This can result in a well known, annoying artifact (created by the dynamic range compression), known as pumping. An aspect of the present invention aims to solve this problem and provide technical benefits by modifying the release behavior of the dynamic range compressor.

An example embodiment in the second class will be described with reference to FIG. 3. The dynamic range compressor of FIG. 3 differs from the conventional dynamic range compressor of FIG. 1 in that the FIG. 3 compressor (but not the FIG. 1 compressor) includes a smoother 11 and a gain adjustment subsystem 13, coupled as shown. The other elements (elements 1, 3, 5, and 7) of the DRC of FIG. 3 are identical to the corresponding (identically numbered) elements of the DRC of FIG. 1. The DRC gains output from DRC gain curve subsystem 5 are identified as gains "gDRC" in FIG. 3.

Figure 3:
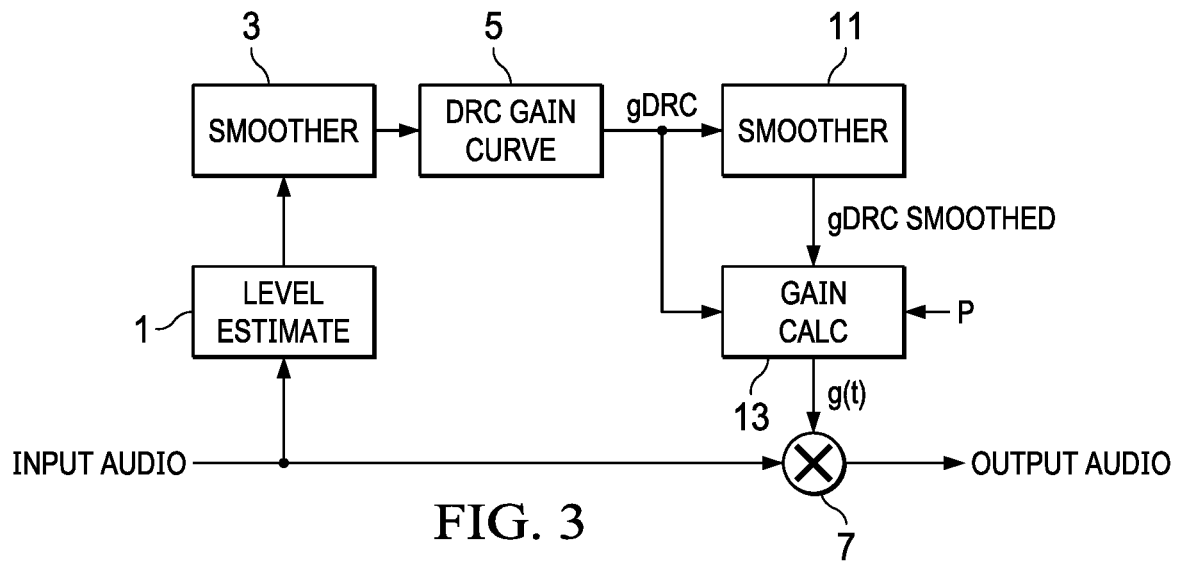
FIG. 3 is a block diagram of another embodiment of the inventive dynamic range compression system.

Elements 3, 5, 11 and 13 of FIG. 3 comprise a DRC gain determining subsystem (implemented in accordance with an embodiment of the invention) which can replace the conventional DRC gain determining subsystem 6 of FIG. 1. In some variations on the implementation shown in FIG. 3, elements 3 and 5 of FIG. 3 are replaced by one of the above-mentioned alternative implementations of DRC gain determining subsystem 6 of FIG. 1.

In the embodiment of FIG. 3, DRC gain smoother 11 is provided to smooth the DRC gains (gDRC) which are output from DRC gain curve subsystem 5, thereby producing smoothed DRC gains (identified as "gDRCsmoothed" in FIG. 3). The smoothed DRC gains, and the gains gDRC (output from subsystem 5), are provided to subsystem 13. In some implementations, gain adjustment subsystem 13 is configured to output (as the current gain value of g(t), which is to be applied by subsystem 7) the smaller of each gain value, gDRC, and the corresponding smoothed gain, gDRCsmoothed, so that the output of subsystem 13 in response to each gain value, gDRC, is:

min(gDRC, gDRCsmoothed).

When a segment of the input audio has regular transients (e.g., a sequence of identical or similar transients, such as, for example, a sequence of drum hits), smoother 11 will catch up to subsystem 5, in the sense that subsystem 13 will reach a state in which it outputs (i.e., provides to subsystem 7) the current "gDRCsmoothed" values (output from smoother 11) rather than the corresponding gain values "gDRC" output from subsystem 5. During such operation, application by subsystem 7 of the gDRCsmoothed values (rather than the corresponding values gDRC) effectively slows the release of DRC application by the system, thus reducing (or preventing occurrence of) the pumping artifact. In typical operation (in response to a segment of input audio having regular transients), subsystem 13 will initially output the current gain values, gDRC, which causes the FIG. 3 system to operate in a state in which it provide some fast release behavior, until subsystem 13 reaches the state in which it outputs the current "gDRCsmoothed" values (rather than the corresponding gDRC values), at which point the FIG. 3 system implements slower release (i.e., it implements a relatively slow release time constant), thus reducing or preventing occurrence of pumping artifacts. In typical operation (in response to a segment of input audio which does not have regular transients), subsystem 13 will output the current gain values, gDRC, rather than the current "gDRCsmoothed" values (and thus the system implements a relatively fast release time constant).

It has been found useful to implement subsystem 13 to operate in response to a user-specified parameter, p, that allows the user to trade off pumping artifacts and loudness by selecting different values of the parameter, p (sometimes referred to as a "pumping parameter"). In such an implementation, subsystem 13 outputs a final gain, g (i.e., one value of the time varying gain, g(t)), in response to each gain value, gDRC, and the corresponding smoothed gain, gDRCsmoothed. The final gain, g, has the value:

g=p*gDRC+(1−p)*min(gDRC, gDRCsmoothed), where "p" is a pumping parameter having a user-selectable value in the range from 0 to 1.

Thus, if the user selects p to be equal (or nearly equal) to 1, average loudness of the output audio may be increased (relative to the average output audio loudness when p=0), but undesirable pumping artifacts may occur. If the user selects p to be equal (or nearly equal) to 0, average loudness of the output audio may be less (relative to the average output audio loudness when p=1), but occurrence of pumping artifacts may be reduced or prevented.

In a preferred implementation, the FIG. 3 system is implemented as a multiband compressor. In such an implementation, the values, gDRCsmoothed, and typically also the values gDRC, are determined on a per band basis, and different choices of the pumping parameter, p, can be made for different frequency bands. It can be helpful to allow lower frequency bands to have larger values of p.

In accordance with some embodiments of the invention, a DRC system belongs to both the first class of embodiments and the second class of embodiments. For example, the system may implement the artifact-reducing aspects of the second class of embodiments (e.g., its DRC gain determining subsystem may include elements 11 and 13 of the FIG. 3 implementation) and the DRC reducing aspects of the first class of embodiments (e.g., it may include elements identical to or corresponding to slow smoother 2 and subsystem 4 of FIG. 2, or elements corresponding to subsystems 8 and 4 of FIG. 2A).

A third class of embodiments of the present invention is directed at reducing breathing artifacts during performance of DRC on decaying input audio. Typical embodiments in the third class control (e.g., include a subsystem which is configured to control) a release time constant (of the release of each application of dynamic range compression) in response to a loudness slope of the input audio signal. This control typically implements a faster release time constant (to reduce or prevent occurrence of breathing artifacts) in response to increased steepness of the loudness slope, and a slower release time constant (to reduce or prevent occurrence of pumping artifacts) in response to a decreased steepness of the loudness slope.

An example embodiment in the third class will be described with reference to FIG. 4. The dynamic range compressor of FIG. 4 differs from the conventional dynamic range compressor of FIG. 3 in that the FIG. 4 compressor (but not the FIG. 3 compressor) includes a loudness slope estimation subsystem 15, coupled as shown. The other elements (elements 1, 3, 5, 7, 11, and 13) of the DRC of FIG. 4 are identical to the corresponding (identically numbered) elements of the DRC of FIG. 3.

Figure 4:
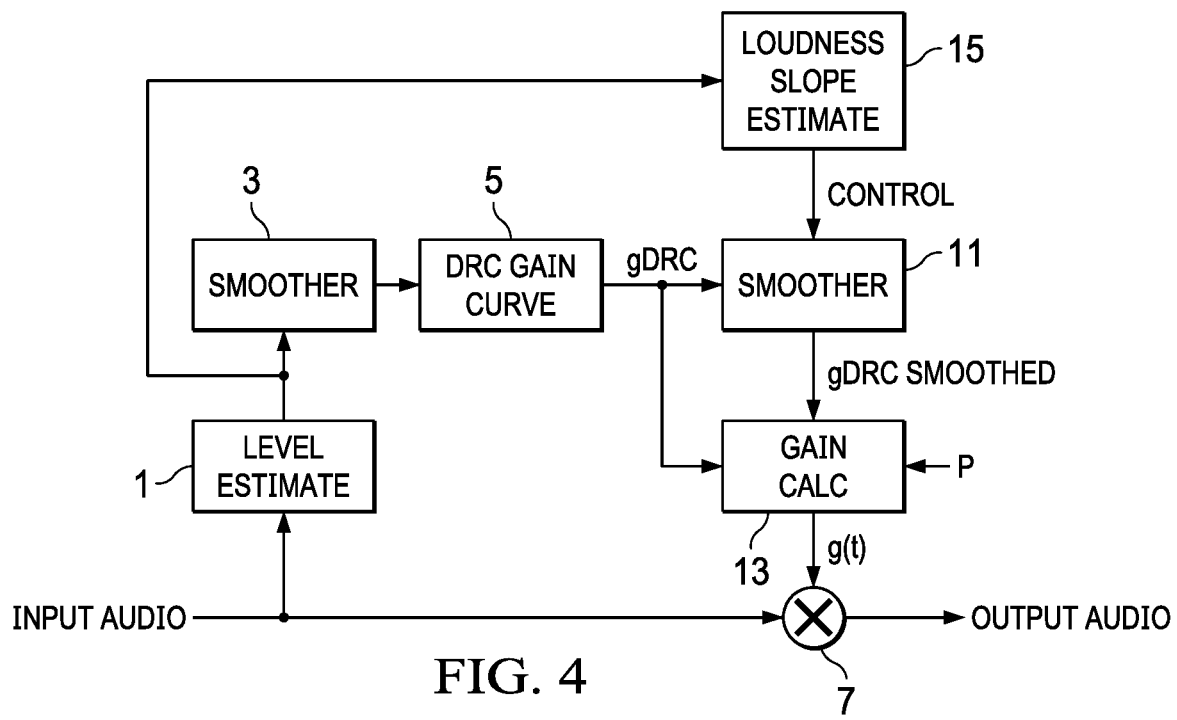
FIG. 4 is a block diagram of another embodiment of the inventive dynamic range compression system.

Elements 3, 5, 11, 13, and 15 of FIG. 4 comprise a DRC gain determining subsystem (implemented in accordance with an embodiment of the invention) which can replace the conventional DRC gain determining subsystem 6 of FIG. 1. In variations on the implementation shown in FIG. 4, elements 3 and 5 of FIG. 4 are replaced by one of the above-mentioned alternative implementations of DRC gain determining subsystem 6 of FIG. 1.

The breathing artifact is a well known artifact that can occur as a result of dynamic range compression, and can be especially annoying when the input audio is getting quieter (decaying) and the DRC (dynamic range compressor) is applying (e.g., during a release interval of application of dynamic range compression) increasing gain thereto. Depending on the relative time constants of the decaying input audio and the compressor release, the breathing artifact may cause the loudness of the output audio to increase when the listener (or audio content creator) is expecting the audio to be getting quieter.

The averaged loudness (level or power) of the input audio signal typically changes over time, and has a slope (sometimes referred to herein as a loudness slope) which is the rate of change over time of the input audio signal's averaged level or power. In this context, the time, over which the averaged loudness is determined, need not be longer (or much longer) than the above-mentioned DRC application time. In accordance with an aspect of the FIG. 4 embodiment, subsystem 15 is provided to generate an estimate (e.g., a time smoothed estimate) of the loudness slope of the input audio signal's averaged loudness (average level or power). In the FIG. 4 implementation, subsystem 15 is configured to generate this loudness slope estimate based on the estimated level or power (of the input audio signal) determined by level estimator 1. Alternatively, the loudness slope estimate is generated in another manner (e.g., based on loudness metadata corresponding to the input audio).

The estimated level or power (of the input audio signal) determined by subsystem 1 typically varies over time, and subsystem 15 may be configured to determine for each time (from a corresponding sequence of estimated levels or powers output from subsystem 1) a time smoothed estimate of the loudness slope. In response to the estimate of loudness slope, subsystem 15 generates a control signal (identified as "control" in FIG. 4) and provides the control signal to smoother 11. In response to increasing steepness of the loudness slope (i.e., in response to increasing values of a positive loudness slope, or increasing (less negative) values of a negative loudness slope), the control signal generated by subsystem 15 changes the time constant of the smoothing performed by smoother 11 to allow the release time constant (of the release of each application of dynamic range compression by the FIG. 4 system) to be faster. In other words, in response to increasing steepness of the loudness slope, the control signal generated by subsystem 15 changes the time constant of the smoothing performed by smoother 11 such that the smoothed gain values (gDRCsmoothed) output from smoother 11 cause subsystem 13 to output gain values which effectively allow faster release of dynamic range compression application. A faster release time constant, resulting from increasing steepness of the loudness slope, typically reduces (or prevents occurrence of) breathing artifacts.

In response to decreasing steepness of the loudness slope, the control signal generated by subsystem 15 changes the time constant of the smoothing performed by smoother 11 to allow the release time constant (of the release of each application of dynamic range compression by the FIG. 4 system) to be slower. As explained above with reference to FIG. 3, such a slower release time constant can reduce (or prevent occurrence of) pumping artifacts, and can also reduce (or prevent the occurrence of, or make less noticeable) breathing artifacts.

In one preferred embodiment, the time constant used (by smoother 11) to calculate the values gDRCsmoothed (in response to the values gDRC) is scaled by the loudness slope (determined by subsystem 15, from the level estimates generated on the full wide-band input audio) to be in a range from about 2 seconds to about 6 seconds.

In a variation on the FIG. 4 system (which is an alternative embodiment of the invention), elements 3 and 5 of FIG. 4 are replaced by an implementation of DRC gain determining subsystem 6 (e.g., any of the implementations of subsystem 6 of FIG. 2), and the control signal generated by loudness slope estimation subsystem 15 is used to directly control (e.g., increase) the release time of such subsystem 6, rather than to control smoother 11. In such an embodiment, elements 11 and 13 are optionally omitted.

In accordance with some embodiments of the invention, a DRC system belongs to both the first class of embodiments and the third class of embodiments. For example, the system may implement both the artifact-reducing aspects of the third class of embodiments (e.g., its DRC gain determining subsystem may include elements 11, 13, and 15 of the FIG. 4 implementation) and the DRC reducing aspects of the first class of embodiments (e.g., it may include elements identical to or corresponding to slow smoother 2 and subsystem 4 of FIG. 2, or elements corresponding to subsystems 8 and 4 of FIG. 2A).

Example embodiments (EEs) of the present invention include the following:

EE1. A method for performing dynamic range compression (DRC) on an input audio signal to generate an output audio signal, the method comprising:
  (a) determining average loudness of the input audio signal, where the average is over a time longer than a DRC application time of the DRC, where the DRC application time is an attack time or a release time of an instance of application of the DRC, or a duration of an instance of application of the DRC; and (b) applying reduced DRC to the input audio signal when the average loudness of the input audio signal approaches, or matches, or exceeds a target, thereby generating the output audio signal, and otherwise applying full DRC to the input audio signal to generate the output audio signal.

EE2. The method of EE1, wherein the target is a knee point for the DRC, or an audio signal level which is at least substantially equal to a maximum playback level of a playback system or device which is to play the output audio signal.

EE3. The method of EE1 or EE2, wherein the input audio signal has multiple frequency bands, and step (b) includes determining DRC gains for individual ones of the frequency bands and applying the DRC gains to said individual ones of the frequency bands.

EE4. The method of EE3, wherein step (a) includes determining a wideband average loudness of the input audio signal, and step (b) includes applying the reduced DRC to each of the frequency bands when the wideband average loudness approaches, or matches, or exceeds the target.

EE5. The method of EE3, wherein step (a) includes determining average loudness of each of the frequency bands, and step (b) includes applying the reduced DRC to each of the frequency bands whose average loudness approaches, or matches, or exceeds the target.

EE6. The method of EE3, wherein determining the DRC gains includes smoothing of gains for individual ones of the frequency bands across said individual ones of the frequency bands to improve timbre.

EE7. The method of EE1, EE2, EE3, EE4, EE5, or EE6, wherein step (b) includes:

determining a dynamic DRC gain, gDRC;

smoothing the dynamic DRC gain, gDRC, to generate a smoothed dynamic gain, gDRCsmoothed;

determining a dynamic gain, g, based on a minimum determination of the DRC gain, gDRC, and the smoothed dynamic gain, gDRCsmoothed; and applying the dynamic gain, g, to the input audio signal.

EE8. The method of EE7, wherein the dynamic gain, g, is:

g=p*gDRC+(1−p)*min(gDRC, gDRCsmoothed), where "p" is a pumping parameter having a value in the range from 0 to 1.

EE9. The method of EE1, EE2, EE3, EE4, EE5, EE6, EE7, or EE8, wherein the input audio signal has a loudness slope, and wherein the method further comprises:

controlling a release time constant, for application of the reduced DRC and the full DRC, in response to the loudness slope of the input audio signal.

EE10. The method of EE9, wherein the release time constant is controlled to be faster in response to increased steepness of the loudness slope, and to be slower in response to decreased steepness of the loudness slope.

EE11. A method for performing dynamic range compression (DRC) on an input audio signal to generate an output audio signal, the method comprising:

determining a level estimate of the input audio signal;

determining a dynamic DRC gain, gDRC, by DRC gain curve application to the level estimate;

smoothing the dynamic DRC gain, gDRC, to generate a smoothed dynamic gain, gDRCsmoothed;

determining a dynamic gain, g, based on a minimum determination of the DRC gain, gDRC, and the smoothed dynamic gain, gDRCsmoothed; and applying the dynamic gain, g, to the input audio signal, thereby generating the output audio signal.

EE12. The method of EE11, wherein the dynamic gain, g, is:

g=p*gDRC+(1−p)*min(gDRC, gDRCsmoothed), where "p" is a pumping parameter having a value in the range from 0 to 1.

EE13. The method of EE11 or EE12, wherein the input audio signal has a loudness slope, and wherein the method further comprises:

controlling a release time constant for application of DRC to the input audio signal, in response to the loudness slope of the input audio signal.

EE14. The method of EE13, wherein the release time constant is controlled to be faster in response to increased steepness of the loudness slope, and to be slower in response to decreased steepness of the loudness slope.

EE15. The method of EE13, wherein the controlling of the release time constant includes controlling a time constant for performance of smoothing to generate the smoothed dynamic gain, gDRCsmoothed.

EE16. The method of EE11, EE12, EE13, EE14, or EE15, wherein the input audio signal has multiple frequency bands, the dynamic gain, g, includes individual band gains for individual ones of the frequency bands, and the step of applying the dynamic gain, g, includes:

applying the individual band gains to individual ones of the frequency bands of the input audio signal.

EE17. A system for performing dynamic range compression (DRC) on an input audio signal, comprising:

a level estimation subsystem, coupled and configured to determine a level estimate of the input audio signal;

a DRC gain curve subsystem, coupled and configured to determine a dynamic DRC gain, gDRC, by DRC gain curve application to the level estimate;

a gain determining subsystem, coupled and configured to smooth the dynamic DRC gain, gDRC, to generate a smoothed dynamic gain, gDRCsmoothed, and to determine a dynamic gain, g, including by determining a minimum of each pair of corresponding values of the DRC gain, gDRC, and the smoothed dynamic gain, gDRCsmoothed; and a gain application subsystem, coupled and configured applying the dynamic gain, g, to the input audio signal, thereby generating the output audio signal, wherein the gain determining subsystem is configured to determine the dynamic gain, g, such that the system implements a first release time constant when applying said dynamic gain, g, to a segment of the input audio signal including regular transients, and such that the system implements a release time constant faster than the first release time constant, when applying said dynamic gain, g, to a different segment of the input audio signal which does not include regular transients.

EE18. The system of EE 17, wherein the dynamic gain, g, is:

g=p*gDRC+(1−p)*min(gDRC, gDRCsmoothed), where "p" is a pumping parameter having a selectable value in the range from 0 to 1.

EE19. The system of EE17 or EE18, wherein the input audio signal has a loudness slope, and wherein the gain determining subsystem is configured to control a release time constant for application of DRC to the input audio signal, in response to the loudness slope of the input audio signal.

EE20. The system of EE19, wherein the gain determining subsystem is configured to cause the release time constant to be faster in response to increased steepness of the loudness slope, and to be slower in response to decreased steepness of the loudness slope.

EE21. The system of EE19, wherein the gain determining subsystem is configured to control the release time constant including by controlling a time constant for performance of smoothing to generate the smoothed dynamic gain, gDRCsmoothed.

EE22. A system for performing dynamic range compression (DRC) on an input audio signal, comprising:
a loudness determination subsystem, coupled and configured to determine average loudness of the input audio signal, where the average is over a time longer than a DRC application time of the DRC, where the DRC application time is an attack time or a release time of an instance of application of the DRC, or a duration of an instance of application of the DRC; and
a gain determination and application subsystem, coupled and configured to apply reduced DRC to the input audio signal when the average loudness of the input audio signal approaches, or matches, or exceeds a target, thereby generating the output audio signal, and otherwise to apply full DRC to the input audio signal to generate the output audio signal.

EE23. The system of EE22, wherein the target is a knee point for the DRC, or an audio signal level which is at least substantially equal to a maximum playback level of a playback system or device which is to play the output audio signal.

EE24. The system of EE22 or EE23, wherein the input audio signal has multiple frequency bands, and the gain determination and application subsystem is configured to determine DRC gains for individual ones of the frequency bands and to apply the DRC gains to said individual ones of the frequency bands.

EE25. The system of EE22, EE23, or EE24, wherein the gain determination and application subsystem is configured to:
determine a dynamic DRC gain, gDRC;
smooth the dynamic DRC gain, gDRC, to generate a smoothed dynamic gain, gDRCsmoothed;
determine a dynamic gain, g, based on a minimum determination of the DRC gain, gDRC, and the smoothed dynamic gain, gDRCsmoothed; and
and apply the dynamic gain, g, to the input audio signal.

EE26. The system of EE25, wherein the dynamic gain, g, is:
g=p*gDRC+(1−p)*min(gDRC, gDRCsmoothed), where "p" is a pumping parameter having a value in the range from 0 to 1.

EE27. The system of EE22, EE23, EE24, EE25, or EE26, wherein the input audio signal has a loudness slope, and wherein the gain determination and application subsystem is configured to:
control a release time constant, for application of the reduced DRC and the full DRC, in response to the loudness slope of the input audio signal.

EE28. The system of EE22, EE23, EE24, EE25, EE26, or EE27, wherein the gain determination and application subsystem is configured to cause the release time constant to be faster in response to increased steepness of the loudness slope, and to be slower in response to decreased steepness of the loudness slope.

Various modifications to the implementations described in this disclosure may be readily apparent to those having ordinary skill in the art. The general principles defined herein may be applied to other implementations without departing from the spirit or scope of this disclosure. Thus, the claims are not intended to be limited to the specific implementations described and shown herein, but are to be accorded the widest scope consistent with this disclosure.

The methods and systems described in the present disclosure may be implemented as software, firmware and/or hardware. For example, certain components (e.g., each of elements 1, 2, 4, 6, and 7 of FIG. 2, or each of elements 1, 4, 6, 7, and 8 of FIG. 2A, or each of elements 1, 3, 5, 7, 11, and 13 of FIG. 3, or each of elements 1, 3, 5, 7, 11, 13, and 15 of FIG. 4) may be implemented as software running on a digital signal processor (e.g., having an input coupled to receive the input audio signal) or microprocessor. Some components may be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the Internet. Typical devices making use of the methods and systems described in the present disclosure are portable electronic devices or other consumer equipment which are used to store and process (e.g., to implement playback of or to render) audio signals (e.g., the output audio signal generated in accordance with any embodiment of the inventive system or method).

What is claimed is:

1. A method for performing dynamic range compression (DRC) on an input audio signal to generate an output audio signal, the method comprising:
(a) determining an average loudness of the input audio signal, wherein loudness denotes a level or a power of the input audio signal, where the average loudness is determined over a time longer than a DRC application time of the DRC, where the DRC application time is an attack time or a release time of an instance of application of the DRC which applies non-unity gain, or for which a DRC gain curve determines non-unity gain, after the attack time and before the release time, or a duration of an instance of application of the DRC including the attack time and the release time; and
(b) applying a reduced DRC to the input audio signal to generate the output audio signal by controlling DRC gains to approach unity gains when the average loudness of the input audio signal approaches, or matches, or exceeds a target, and otherwise applying the DRC gains to the input audio signal to generate the output audio signal, wherein the target is a knee point for the DRC.

2. The method of claim 1, wherein the input audio signal has multiple frequency bands.

3. The method of claim 2, wherein step (b) includes determining a DRC gain for at least one frequency band of the multiple frequency bands and applying the DRC gain to said frequency band.

4. The method of claim 2, wherein step (b) includes determining DRC gains for individual ones of the frequency bands and applying the DRC gains to said individual ones of the frequency bands.

5. The method of claim 4, wherein determining the DRC gains includes smoothing gains for individual ones of the frequency bands across said individual ones of the frequency bands to improve timbre.

6. The method of claim 2, wherein step (a) includes determining a wideband average loudness of the input audio signal, and step (b) includes applying the reduced DRC to each of the frequency bands when the wideband average loudness approaches, or matches, or exceeds the target.

7. The method of claim 2, wherein step (a) includes determining a respective average loudness for each of the frequency bands, and step (b) includes applying the reduced DRC to each of the frequency bands whose average loudness approaches, or matches, or exceeds the target.

8. The method of claim 1 wherein step (b) includes:
determining a dynamic DRC gain, gDRC;
smoothing the dynamic DRC gain, gDRC, to generate a smoothed dynamic gain, gDRCsmoothed;
determining a dynamic gain, g, based on a minimum determination of the DRC gain, gDRC, and the smoothed dynamic gain, gDRCsmoothed; and
applying the dynamic gain, g, to the input audio signal.

9. The method of claim 8, wherein the dynamic gain, g, is:
g=p*gDRC+(1−p)*min(gDRC, gDRCsmoothed), where "p" is a pumping parameter having a value in the range from 0 to 1.

10. The method of claim 9, wherein the value of the pumping parameter in the range from 0 to 1 is selectable by a user.

11. The method of claim 1, wherein the input audio signal has a loudness slope, and wherein the method further comprises:
controlling a release time constant, for application of the reduced DRC and the DRC, in response to the loudness slope of the input audio signal.

12. The method of claim 11, wherein the release time constant is controlled to be faster in response to increased steepness of the loudness slope, and to be slower in response to decreased steepness of the loudness slope.

13. A method for performing dynamic range compression (DRC) on an input audio signal to generate an output audio signal, the method comprising:
determining a level estimate of the input audio signal;
determining a dynamic DRC gain, gDRC, by DRC gain curve application to the level estimate;
smoothing the dynamic DRC gain, gDRC, to generate a smoothed dynamic gain, gDRCsmoothed;
determining a dynamic gain, g, based on a minimum determination of the DRC gain, gDRC, and the smoothed dynamic gain, gDRCsmoothed; and
applying the dynamic gain, g, to the input audio signal, thereby generating the output audio signal.

14. The method of claim 13, wherein the dynamic gain, g, is:
g=p*gDRC+(1−p)*min(gDRC, gDRCsmoothed), where "p" is a pumping parameter having a value in the range from 0 to 1.

15. The method of claim 14, wherein the value of the pumping parameter in the range from 0 to 1 is selectable by a user.

16. The method of claim 13 wherein the input audio signal has a loudness slope, and wherein the method further comprises:
controlling a release time constant for application of DRC to the input audio signal, in response to the loudness slope of the input audio signal.

17. The method of claim 16, wherein the release time constant is controlled to be faster in response to increased steepness of the loudness slope, and to be slower in response to decreased steepness of the loudness slope.

18. The method of claim 16, wherein the controlling of the release time constant includes controlling a time constant for performance of smoothing to generate the smoothed dynamic gain, gDRCsmoothed.

19. The method of claim 13 wherein the input audio signal has multiple frequency bands, the dynamic gain, g, includes individual band gains for individual ones of the frequency bands, and the step of applying the dynamic gain, g, includes:
applying the individual band gains to individual ones of the frequency bands of the input audio signal.

20. A system for performing dynamic range compression (DRC) on an input audio signal, comprising:
a level estimation subsystem, coupled and configured to determine a level estimate of the input audio signal;
a DRC gain curve subsystem, coupled and configured to determine a dynamic DRC gain, gDRC, by DRC gain curve application to the level estimate;
a gain determining subsystem, coupled and configured to smooth the dynamic DRC gain, gDRC, to generate a smoothed dynamic gain, gDRCsmoothed, and to determine a dynamic gain, g, including by determining a minimum of each pair of corresponding values of the DRC gain, gDRC, and the smoothed dynamic gain, gDRCsmoothed; and
a gain application subsystem, coupled and configured applying the dynamic gain, g, to the input audio signal, thereby generating the output audio signal,
wherein the gain determining subsystem is configured to determine the dynamic gain, g, such that the system implements a first release time constant when applying said dynamic gain, g, to a segment of the input audio signal including regular transients, and such that the system implements a release time constant faster than the first release time constant, when applying said dynamic gain, g, to a different segment of the input audio signal which does not include regular transients.

21. A system for performing dynamic range compression (DRC) on an input audio signal, comprising:
a loudness determination subsystem, coupled and configured to determine an average loudness of the input audio signal, wherein loudness denotes a level or a power of the input audio signal, where the average loudness is determined over a time longer than a DRC application time of the DRC, where the DRC application time is an attack time or a release time of an instance of application of the DRC which applies non-unity gain, or for which a DRC gain curve determines non-unity gain, after the attack time and before the release time, or a duration of an instance of application of the DRC including the attack and the release time; and
a gain determination and application subsystem, coupled and configured to apply a reduced DRC to the input audio signal to generate the output audio signal by controlling DRC gains to approach unity gains when the average loudness of the input audio signal approaches, or matches, or exceeds a target, and otherwise to apply the DRC gains to the input audio signal to generate the output audio signal, wherein the target is a knee point for the DRC.

22. The system of claim 21, wherein the input audio signal has multiple frequency bands.

23. The system of claim 22, wherein the gain determination and application subsystem is configured to determine a DRC gain for at least one frequency band of the multiple frequency bands and to apply the DRC gain to said frequency band.

24. The system of claim 22, wherein the gain determination and application subsystem is configured to determine DRC gains for individual ones of the frequency bands and to apply the DRC gains to said individual ones of the frequency bands.

25. The system of claim 24, wherein to determine the DRC gains includes to smooth gains for individual ones of the frequency bands across said individual ones of the frequency bands to improve timbre.

26. The system of claim 22, wherein the gain determination and application subsystem is configured to determine a wideband average loudness of the input audio signal, and to apply the reduced DRC to each of the frequency bands when the wideband average loudness approaches, or matches, or exceeds the target.

27. The system of claim 22, wherein the gain determination and application subsystem is configured to determine a respective average loudness for each of the frequency bands, and to apply the reduced DRC to each of the frequency bands whose average loudness approaches, or matches, or exceeds the target.

* * * * *